United States Patent [19]
Bellemore et al.

[11] Patent Number: 5,999,550
[45] Date of Patent: Dec. 7, 1999

[54] AUTOMATIC OPERATING POINT CALIBRATION

[75] Inventors: Arthur J. Bellemore, Salem, N.H.; John M. McBride, Peabody, Mass.

[73] Assignee: Agfa Corporation, Wilmington, Mass.

[21] Appl. No.: 09/227,592

[22] Filed: Jan. 8, 1999

[51] Int. Cl.[6] .................................................. H01S 3/00
[52] U.S. Cl. ............................................................. 372/38
[58] Field of Search ................................................ 372/38

[56] References Cited

U.S. PATENT DOCUMENTS 4,903,273  2/1990  Bathe ........................................ 372/38
5,761,231  6/1998  Ofenloch et al. ......................... 372/38

Primary Examiner—Leon Scott, Jr.
Attorney, Agent, or Firm—Robert A. Sabourin; C.J. Cianciolo

[57] ABSTRACT

A laser diode driver system automatically tracks the difference between the steady state operating point of a feedback signal in response to a laser diode driver circuit operation and the steady state operating point of the same feedback signal in response to a dummy driver circuit operation. That difference is used to compensate the dummy driver circuit operation such that its operating point correlates with the laser diode driver circuit operation. Further, in accordance with a second aspect of the present invention, a laser diode driver system automatically tracks the difference between the steady state operating point of a feedback signal in response to the quiescent laser diode driver circuit operation and the steady state operating point of the same feedback signal in response to the output of a high frequency oscillator. That difference is used to adjust a variable current source such that a dummy driver circuit is not disabled until the laser diode turn-on time delay has expired. The disablement is extended when the current drawn by the current source changes the discharge time of a capacitor that is connected to the enable signal for the dummy driver circuit.

19 Claims, 9 Drawing Sheets

AUTOMATIC OPERATING POINT CALIBRATION

BACKGROUND OF THE INVENTION

Laser diodes and their associated driver circuits are typically used in the electronic prepress imagesetter industry to convert digital image data, generated by an application running on a host computer system, for example, into images on photosensitive media. The photosensitive media typically contains the arrangement of pixels for a red, green or blue color component of the digitized image.

One common configuration is termed an internal drum imagesetter. In such a device, the photosensitive media is mounted along the inside surface of a drum or cylinder. A laser diode is located at or near the center of the drum on a carriage that allows translation along the drum axis. The output beam from the laser diode is scanned by a rotating mirror across the media in successive circumferentially extending bands or paths referred to as scan lines. The laser diode output beam exposes specific pixel locations of the media along those scan lines to form the desired image. Because the media is associated with a single color component of the image, the laser diode is turned-on or off for those pixel locations that contain that color component and depending on whether a positive or negative image is being generated.

In the past, the laser diode driver circuits have typically been operated at frequencies approaching 1 Megahertz (MHz). Such a laser diode driver circuit is capable of switching the diode on or off within 1 microsecond (i.e. the operating period). Although those laser diode driver circuits can provide the necessary "turn-on current" within that time period, laser diodes typically have a delay of approximately 5 nanoseconds (ns) before beam generation. At that frequency, the 5 ns turn-on time delay represents a relatively inconsequential 0.5 percent of the operating period.

A feedback control circuit typically monitors the beam power generated by the laser diode in relation to a desired beam power. That beam power is typically averaged over one period of the operating frequency by the feedback control circuit. Because the turn-on time delay represents such a small percentage of the overall period, it does not significantly affect the beam power.

Laser diodes, however, have begun to be operated at frequencies exceeding 50 MHz. At such increased frequencies, the operating period is reduced from 1 microsecond to less than 20 nanoseconds. Therefore, the 5 nanosecond turn-on time delay represents at least 25 percent of the total operating period. When the control loop system determines the average beam power output by the laser diode, in relation to the desired power, it erroneously determines that the intensity is 25 percent too low and therefore responsively increases the intensity by 25 percent, for example. Such an intensity increase is undesirable and typically serves to corrupt the resulting image.

A further problem that arises when the operating frequency is increased concerns simulation of the laser diode when it is turned off, such that the feedback control circuit remains in a steady state condition—otherwise, when the laser diode is turned off (for example, in order to impart a black pixel to the photosensitive media) the control loop system will operate in an "open loop" condition. Typically, a dummy laser driver and a dummy load are coupled to the control loop feedback signal when the laser diode is shut off. That dummy laser driver and dummy load are designed to operate in an identical manner to the actual laser diode and laser diode driver circuit. Therefore, when the laser diode is turned back on, the control loop system is already in a steady state condition. Accordingly, little or no compensation to the laser diode output power is required once the laser diode is turned back on.

In the prior art a second laser diode is sometimes used to simulate the dummy load. That approach includes manually inputting calibration factors to adjust the second laser diode such that it more closely simulates the actual laser diode's operation. Such an approach, however, is not automatic and requires time intensive calibration operations.

SUMMARY OF THE INVENTION

In accordance with a first aspect of the present invention, a method and apparatus are provided for automatically correlating the operating characteristics of a dummy laser driver circuit and an actual laser driver circuit.

More specifically, a laser diode driver system is disclosed for automatically tracking the difference between the steady state operating point of a feedback signal in response to the laser diode driver circuit operation and the steady state operating point of the same feedback signal in response to the dummy driver circuit operation. The difference is used to compensate the dummy driver circuit operation such that it correlates with the laser diode driver circuit operation.

In accordance with a second aspect of the present invention, a method and apparatus are provided for automatically performing a burst mode laser time delay correction to compensate for the turn-on time delay associated with a laser diode.

More specifically, a laser diode driver system is disclosed for automatically tracking the difference between the steady state operating point of a feedback signal in response to the quiescent laser diode driver circuit operation and the steady state operating point of the same feedback signal in response to the output of a high frequency oscillator. The difference is used to adjust a variable current source such that a dummy driver circuit is not disabled until the laser diode turn-on time delay has expired. The disablement is extended when the current drawn by the current source changes the discharge time of a capacitor, connected to the enable signal for the dummy driver circuit.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, like reference characters refer to the same parts throughout the different views. The drawings are not necessarily to scale, emphasis instead being placed upon illustrating the principles of the invention. Of the drawings.

DETAILED DESCRIPTION OF THE INVENTION

I. Prepress System

Figure 1:
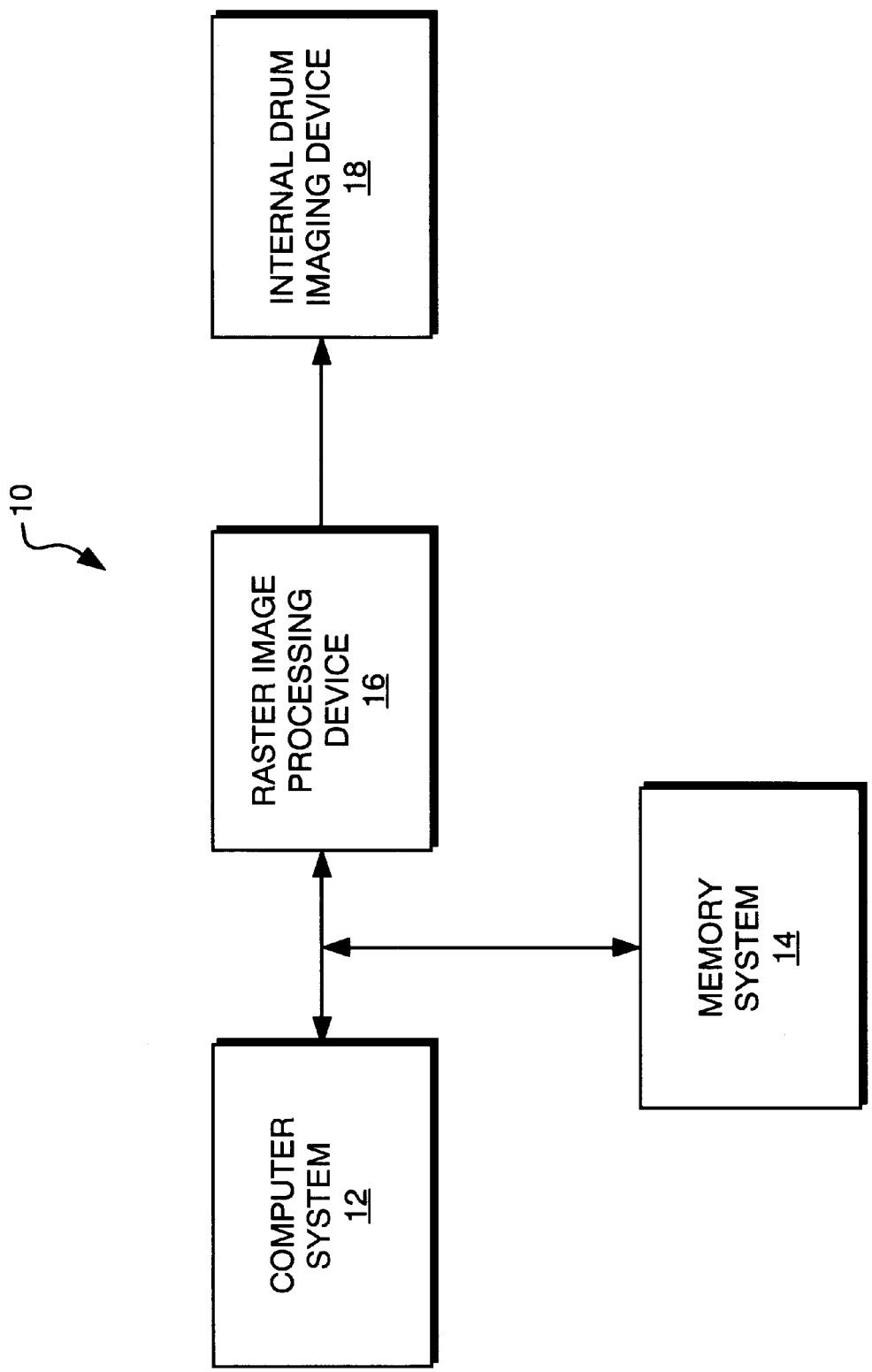
FIG. 1 is a block diagram of an electronic prepress system including an internal drum imaging device.

Referring now to FIG. 1, a block diagram of an electronic prepress system 10 is shown to include a computer system 12 for generating data files containing text and graphics, a memory system 14 for storing those files, and a raster image processing device 16 for converting the text and graphics into red, green and blue digitized data files in a format that is interpreted by an internal drum imaging device 18, or imagesetter.

II. Internal Drum Imaging Device

Figure 2:
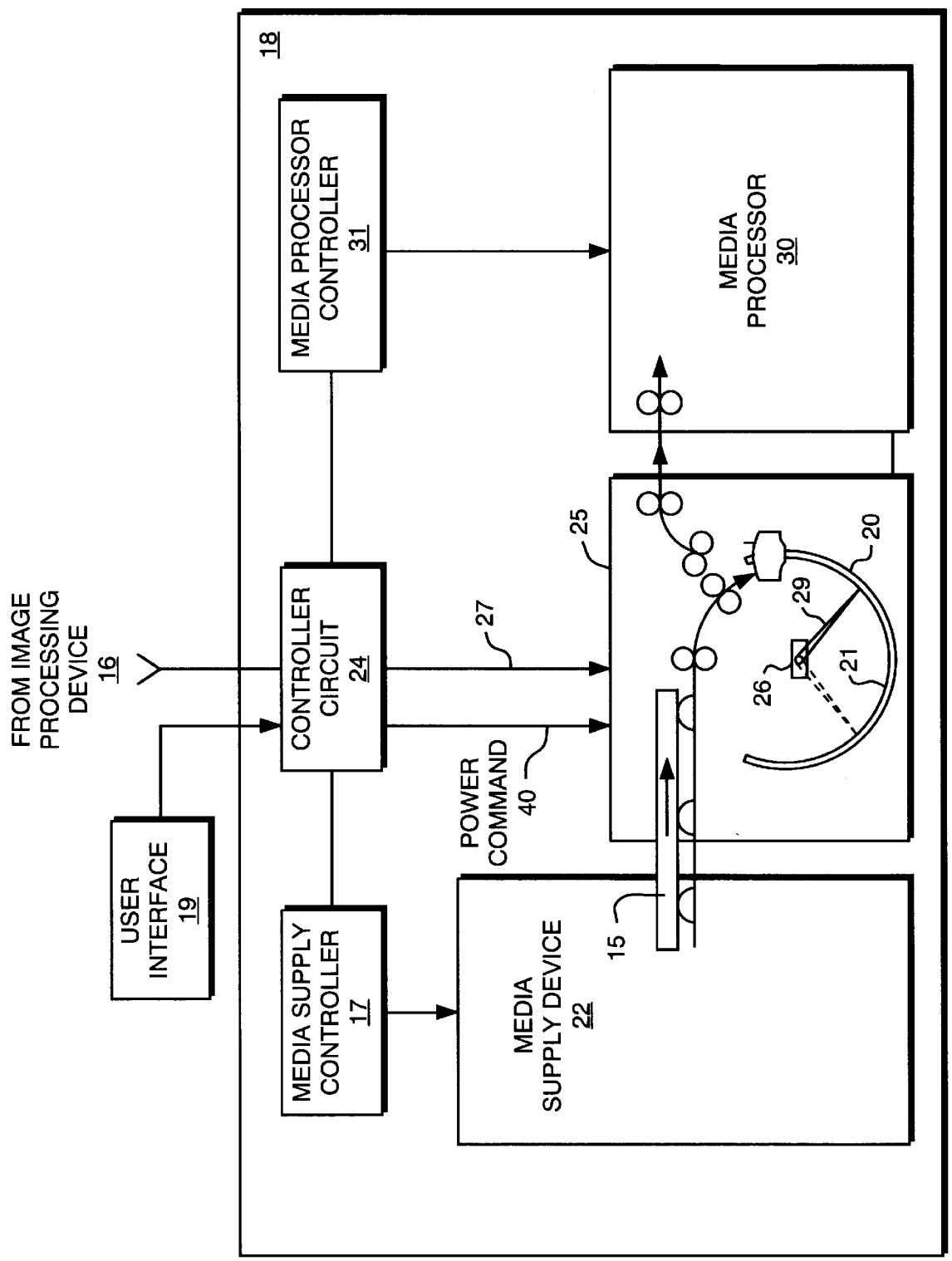
FIG. 2 is a schematic view of the internal drum imaging device of FIG. 1.

FIG. 2 shows the typical internal drum imaging device 18 in greater detail to illustrate the context of the invention. Specifically, a media supply device 22 stores photosensitive media and delivers it to an internal drum unit 25 under the control of media supply controller 17. The photosensitive media is then mounted on the drum's internal surface. Once the photosensitive media has been exposed, it is delivered to media processor 30 for developing under the control of the media processor controller 31.

While the photo sensitive media is mounted on the internal surface 21 of the drum 20, data from the raster image processing device 16 are transferred to a controller circuit 24. The controller circuit 24 is connected to a laser driver system 26 and generates signals 27 that control the output of that laser driver system 26.

The controller circuit 24 is also coupled to a user interface 19 for receiving input from a user for an initial calibration operation. That input results in the generation of a power command signal 40 that is conveyed to the laser driver system. The laser driver system 26 includes a laser diode 28 (see FIG. 4), disposed at the end of a carriage. The carriage also includes a spin mirror for scanning the output beam 29 of the laser diode 28 across the photo sensitive media in a raster scan manner.

More specifically, the laser diode output beam 29 is focused on particular pixel locations along scan lines, which typically extend across the media in a transverse direction. When the beam is scanned to a particular pixel location, that portion of the media is exposed, or not, to represent a white, or colored, pixel or dark pixel in the image. Whether a pixel location is exposed is determined by the data that is transferred from the raster image processing device 16 to the control circuit 24. Accordingly, the laser diode output beam 29 is continuously scanned by the spin mirror from left to right along each scan line of the image and each pixel location along those scan lines is exposed or not exposed, according to the logical values of the digitized data from the raster image processing device 16. If the digitized data indicates that a given pixel location is to be exposed, the laser diode will be "turned-on" when the laser diode beam is focused on that location as it travels along the scan line. Alternatively, if the digitized data indicates that a given pixel location is not to be exposed, the laser diode will be "turned-off" when the laser diode output beam passes that location as it travels along the scan line. It should be noted that, depending upon the characteristics of the image and whether a positive or negative image is being generated, an exposed pixel could be associated with a color such as red, green or blue, or could be associated with the absence of color, such as a black pixel.

Each data file that is transferred to the control circuit 24, from the raster image processing device 16, represents one color component of an image, in one implementation. Accordingly, the pixel locations that are exposed by the laser diode 28 of the present embodiment represent either red, green or blue pixels. Accordingly, three data files are used to generate a red image, a green image and a blue image on three separate sheets of photosensitive media, which, when superimposed during the final printing operation, will result in a full color image.

Figure 3:
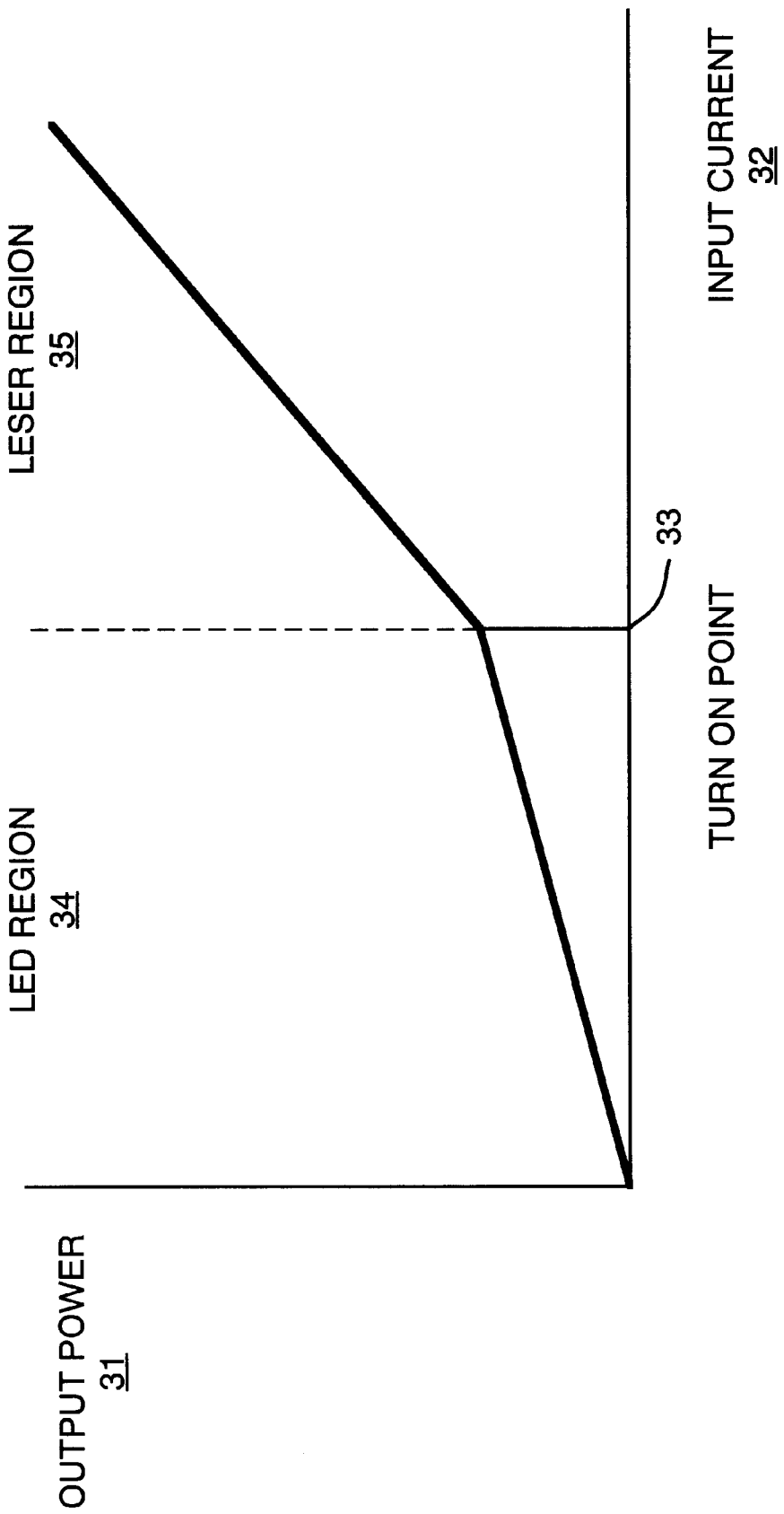
FIG. 3 depicts the operating characteristic curve of the laser diode of the internal drum imaging device of FIG. 2.
Figure 4:
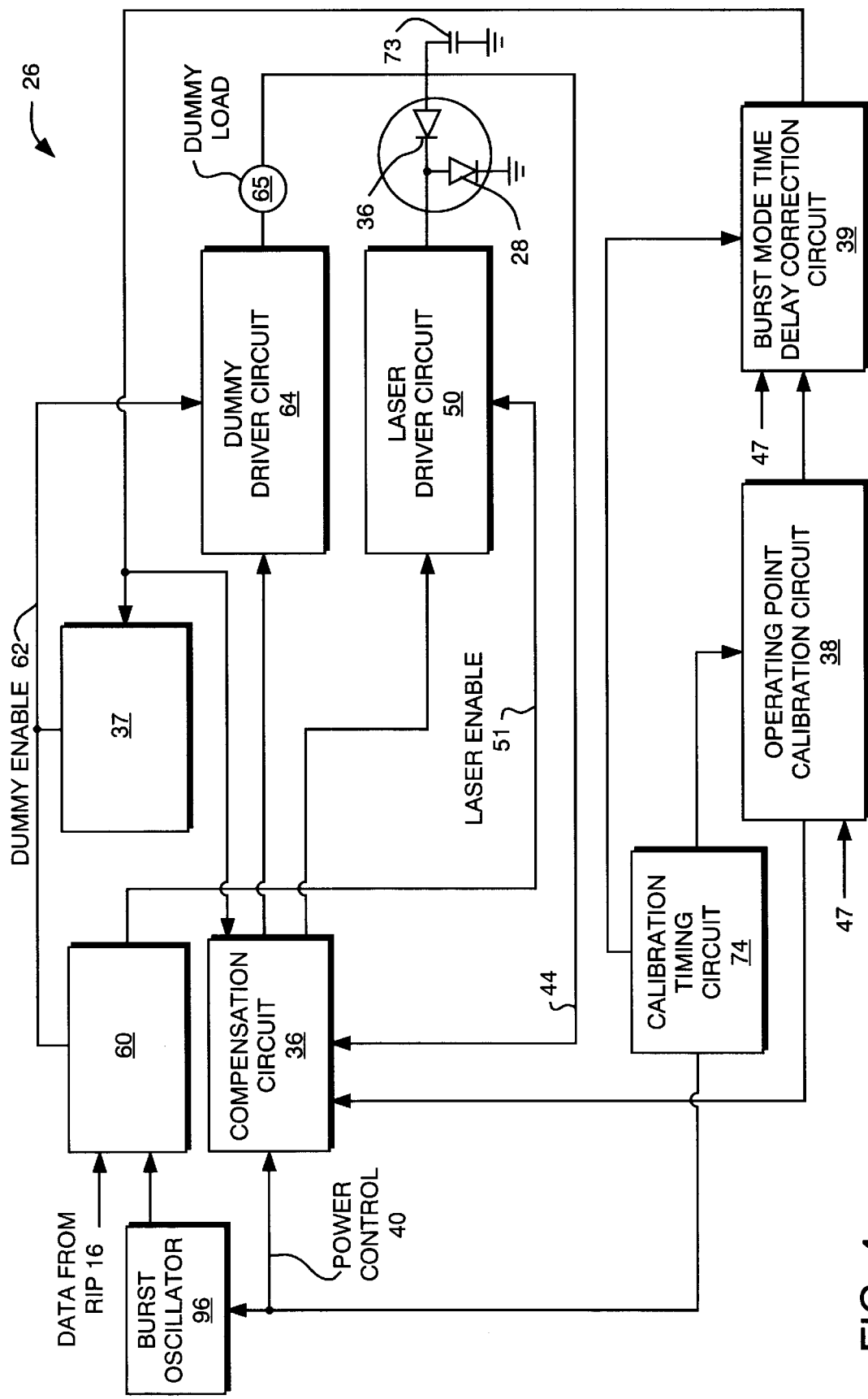
FIG. 4 is a block diagram of the laser driver system of FIG. 2 according to the present invention.

FIG. 3 shows an exemplary operating curve for a laser diode 28 of the laser driver system 26 of FIG. 4 wherein output beam power 31 is plotted as a function of input current 32 to illustrate the operating characteristics of the diode that necessitate driver circuits such as the invention. It can be seen that a laser diode's output beam power rises linearly with rising input current when the device is operating in the LED region 34. When the input current reaches a point referred to as the "turn-on" or "lase point" 33, the device moves into the laser region of operation 35 and the output power increases at an increased rate with respect to input current 32. The laser diode 28 is operated in the laser region 35 in order to expose a pixel location on a scan line, and is operated in the LED region 34 when that pixel location is not intended to be exposed. It is the laser driver system 26 that switches the laser diode 28 between the two regions of operation and that maintains the same amount of output power each time the laser region of operation 35 is entered.

III. Inventive Laser Driver System

FIG. 4 is a block diagram depicting the laser driver system 26, which has been constructed according to the present invention. The laser driver system 26 includes a laser driver circuit 50 that generates current for driving laser diode 28. The laser driver system 26 also includes a dummy driver circuit 64 that generates current for driving a dummy load 65 that is resistively equivalent to the laser region operation of laser diode 28. In other words, the dummy load 65 simulates an operating characteristic (e.g. impedance) of the laser diode 28. A PIN diode 36 is optically coupled to the laser diode 28 to detect a portion of the light generated by the laser diode to provide a feedback signal 44. Alternatively, feedback signal 44 is driven by a current that flows from dummy load 65, in response to the current from dummy driver 64, when the laser driver circuit 50 is disabled.

During normal operation, laser driver 50 is enabled in response to digital data from raster image processing device 16. Laser diode 28 turns-on and exposes a pixel location on the photosensitive media. When the laser driver circuit 50 is subsequently disabled, the dummy driver circuit 64 is enabled such that a steady-state current is maintained on feedback signal 44. Feedback signal 44 conveys that current to a compensation circuit 36 that compares it to the power command signal 40. The power command signal 40 is representative of a desired laser diode output beam power. The difference between those currents is used to compensate the input signals to the laser driver circuit 50 and the dummy driver circuit 64 in a proportional manner.

According to the invention, laser driver system 26 further includes an operating point calibration circuit 38 for correlating the operation of the dummy driver circuit 64 and dummy load 65 to the operation of the laser driver circuit 50 and the laser diode 28. The correlation is performed by sampling the difference between the feedback signal 44 and the power command signal 40 when the laser driver circuit 50 is enabled. That sampled value is compared to the difference between the feedback signal 44 and the power command signal 40 when the dummy driver circuit is enabled. The difference between the two sampled values is used to compensate the input signal to the dummy driver circuit 64 such that its operation correlates to the operation of the laser driver circuit 50.

Laser driver system 26 also includes a burst mode time delay correction circuit 39 that compensates for the turn-on time delay of laser diode 28. That compensation is performed by sampling the difference between the feedback signal 44 and the power command signal 40 while the laser driver circuit 50 and the dummy driver circuit 64 are enabled and disabled at the operating frequency, e.g. 50 MHz. That sample value is compared with the difference between the feedback signal 44 and the power command signal 40 when the laser driver is enabled and operating in a quiescent, or non-transitioning, manner. The result of that comparison operation is input to a circuit 37 that affects the falling edge of the dummy enable signal 62 such that the dummy driver circuit 64 cannot be disabled until the turn-on delay time period of laser diode 28 has expired.

Figure 5A:
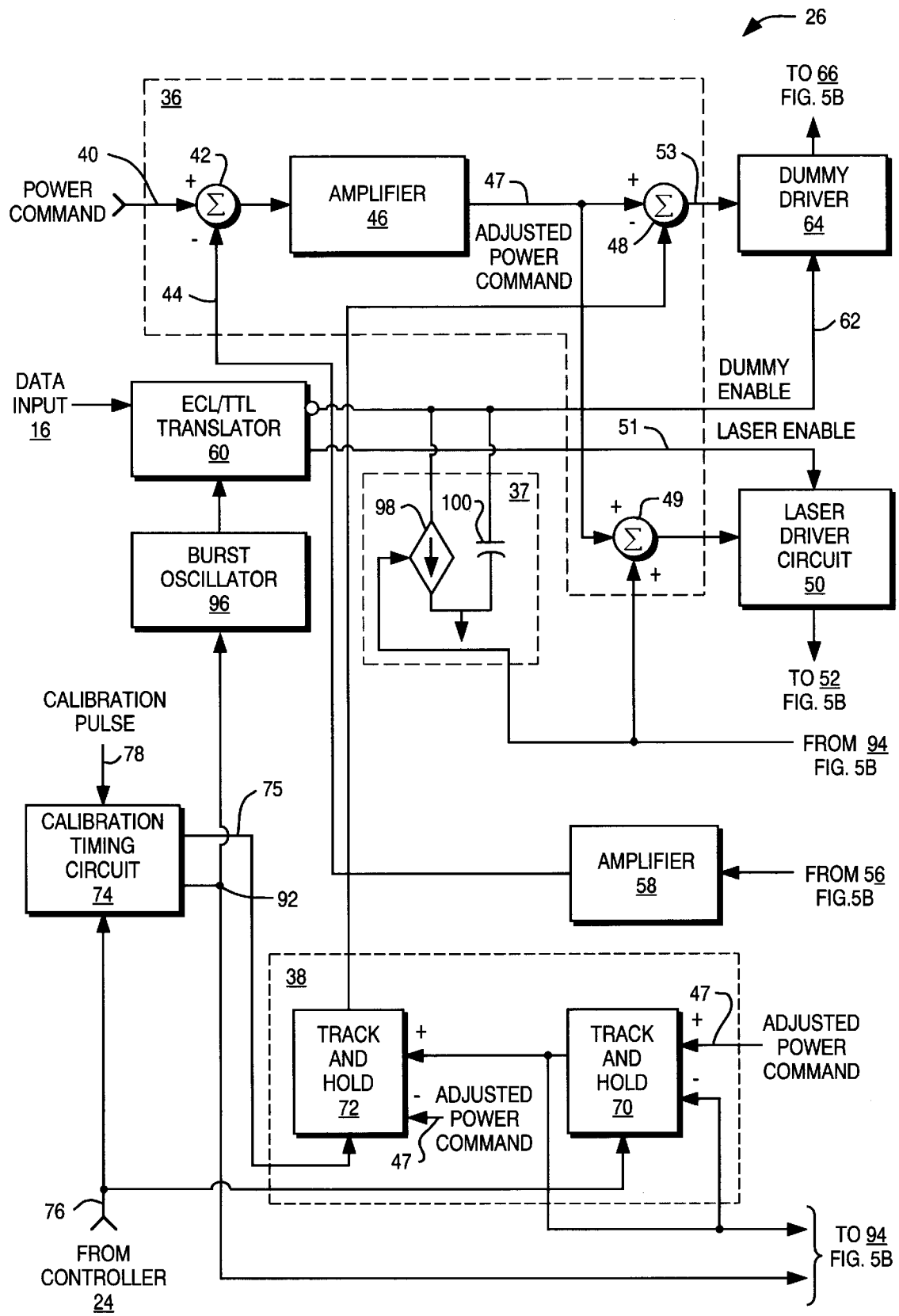
FIG. 5 is a circuit diagram of a laser driver system according to a preferred embodiment of the present invention.
Figure 5B:
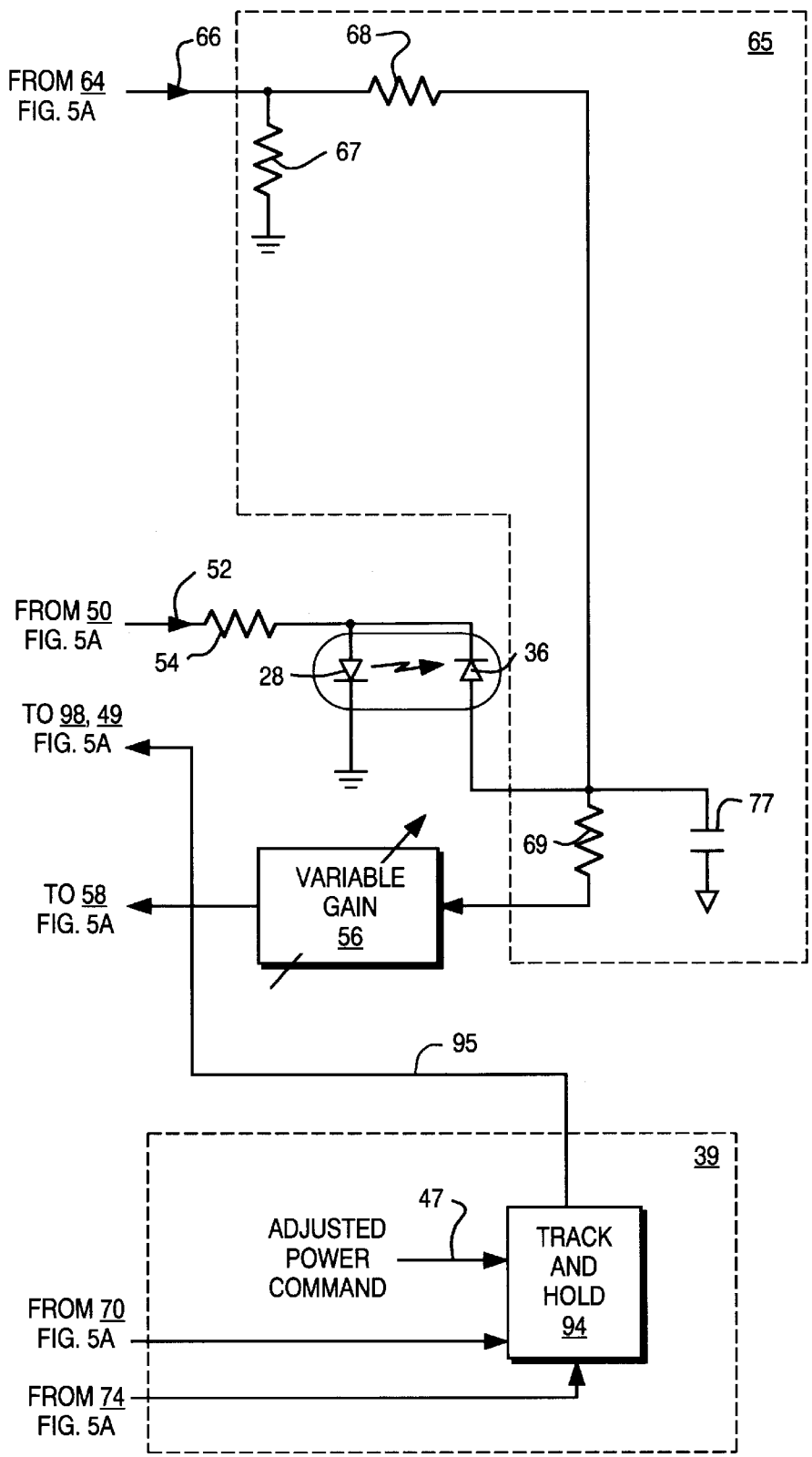

Referring now to the circuit diagram of FIG. 5, the operation of the inventive laser driver system 26 will be more specifically described. An input signal referred to as the power command signal 40 is connected to summing junction 42. The power command signal 40, determined during the initial calibration of the laser driver system 26, represents a desired amount of laser diode output power for the feedback control loop to maintain. The summing junction 42 performs a difference operation between the power command signal 40 and a feedback signal 44, such that the power command signal is adjusted and amplified by amplifier 46. The resulting signal is referred to as the adjusted power command signal 47 and is input to a pair of summing junctions 48 and 49. The adjusted power command signal 47 and a bias control signal 95 are summed by summing junction 49 and input to laser driver circuit 50.

When the laser driver circuit 50 is enabled by laser enable signal 51, it outputs an amount of current 52 that is proportional to the adjusted power command signal 47. That current 52 flows through resistor 54 and into the laser diode 28. When that amount of current reaches the turn-on or lase point, the laser diode 28 enters the laser region of operation and is referred to as being "on" (See FIG. 3). An amount of current that is proportional to the laser diode output power is allowed to pass through PIN diode 36. That current is amplified by a pair of feedback amplifiers 56 and 58 to become feedback signal 44. Feedback signal 44 conveys the amplified current to summing junction 42 such that the power command signal 40 is adjusted. When the laser diode output power is too low, the adjusted power command signal 47 will increase such that the laser driver circuit 50 increases the current to the laser diode 28. Alternatively, when the laser diode output power is too high, the adjusted power command signal 47 will decrease such that the laser driver circuit 50 decreases the current to the laser diode 28. When the system achieves steady state, the feedback signal 44 will have a value indicating that no further adjustment to the laser diode output power is required.

The laser enable signal 51, connected to the laser driver circuit 50, is generated by an ECL/TTL translator circuit 60. The ECL/TTL translator circuit 60 receives an ECL data signal from the raster image processing device 16 and responsively asserts or deasserts a non-inverting TTL output signal (the laser enable signal 51) based upon the logical values of that data signal. Therefore, laser driver circuit 50 is enabled or disabled in response to the data signal output by the raster image processing device 16.

The ECL/TTL translator circuit 60 also generates an inverting output signal (the dummy enable signal 62) that is the inversion of the non-inverting output signal (the laser driver enable signal 51). The dummy enable signal 62 is connected to a dummy driver circuit 64 that is enabled when the laser driver circuit 50 is disabled. The dummy driver circuit 64 is nominally identical to the laser driver circuit 50. When the dummy driver circuit 64 is enabled, it outputs a current 66 to the dummy load 65 in response to the input signal 53. The dummy load in this example includes a combination of resistors 67, 68, 69 and a capacitor 77. The values of resistors 67, 68 and 69 are chosen such that they reflect the equivalent resistance provided by the combination of resistor 54 and the laser diode 28, when it is operating in the laser region of operation. Moreover, the value of the capacitor 77 and 73 are substantially equal.

Accordingly, the current flowing through the combination of resistors 67 and 68 is amplified by feedback amplifiers 56 and 58 to generate feedback signal 44. Therefore, during the time when laser driver circuit 50 is disabled, the feedback loop is maintained at steady state. Also, when laser driver circuit 50 is re-enabled, the laser diode can respond immediately with the proper amount of output power.

As previously mentioned, the laser driver circuit 50 and the dummy driver circuit 64 are nominally identical circuits. Also, the combination of resistors 67 and 68 are nominally resistive equivalents of the combination of resistor 54 and laser diode 28. Therefore, the two circuits have to be correlated to compensate for variations in those devices. The output of a calibration circuit, referred to as the operating point calibration circuit 38, is input to summing junction 48 to further adjust the adjusted power command signal 47.

IV. Automatic Operating Point Correlation

Figure 6:
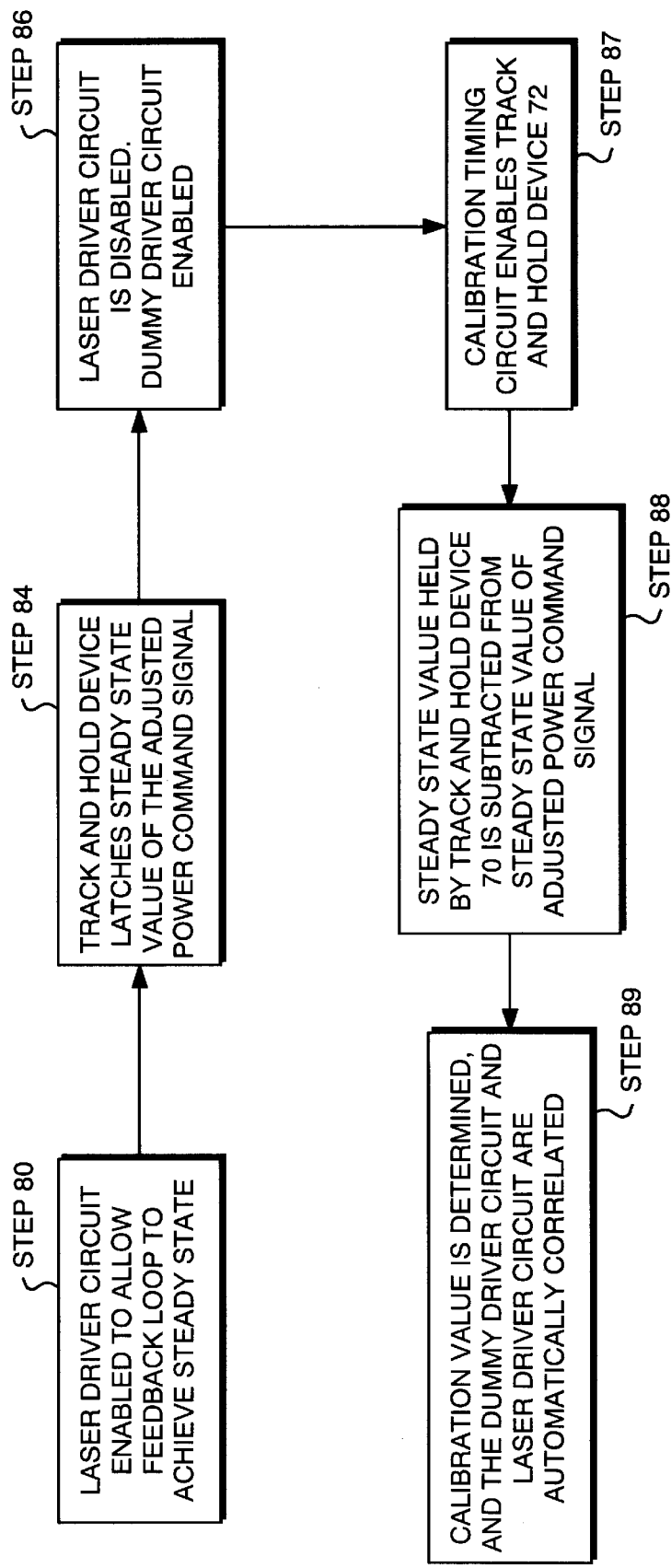
FIG. 6 is a flow diagram showing the operation of the laser driver system shown in FIG. 4 according to the invention.

The automatic operating point calibration circuit 38 is shown to include a pair of track and hold devices 70 and 72 and operates together with a calibration timing generator 74. The operation of the automatic calibration circuit will now be described with respect to the flow diagram of FIG. 6. As previously stated, the laser diode output beam 28 is scanned by the spin mirror in a raster scan manner to expose, or not-expose, pixel locations along scan lines formed on the photo sensitive media. At the end of each scan line, a laser calibration pulse train 76 enables the laser driver circuit 50 for approximately twelve microseconds to allow the feedback loop to achieve a quiescent, steady state condition (Step 80). The track and hold device 70 is responsively enabled and holds the steady state value of the adjusted power command signal 47 at its output (Step 84). That steady state value remains at the output of the track and hold device 70 as long as the device is enabled. Next, the laser driver circuit 50 is disabled and the dummy driver circuit 64 is enabled by manipulation of the data input signal to the ECL/TTL translator 60 (Step 86). When the feedback loop again achieves a steady state condition, the calibration timing circuit 74 enables track and hold device 72, via enable signal 75 (Step 87). The steady state value held by track and hold device 70 is subtracted from the current steady state value of the adjusted power command signal 47 to provide a difference or error signal (Step 88). Therefore, the difference between the steady state values of the adjusted power command signal 47 due to the laser driver circuit 50 and due to the dummy driver circuit 64 is calculated, and is output from track and hold device 72. That difference or error signal represents a calibration value that is subtracted from the adjusted power command signal 47 by summing junction 48 such that the operating point of the dummy driver circuit 64 is automatically correlated to the operating point of the laser driver circuit 50 (Step 89). The correlation value is held at the output of track and hold device 72 until the end of the next scan line when this correlation operation is repeated.

V. Burst Mode Time Delay Correction

Figure 7:
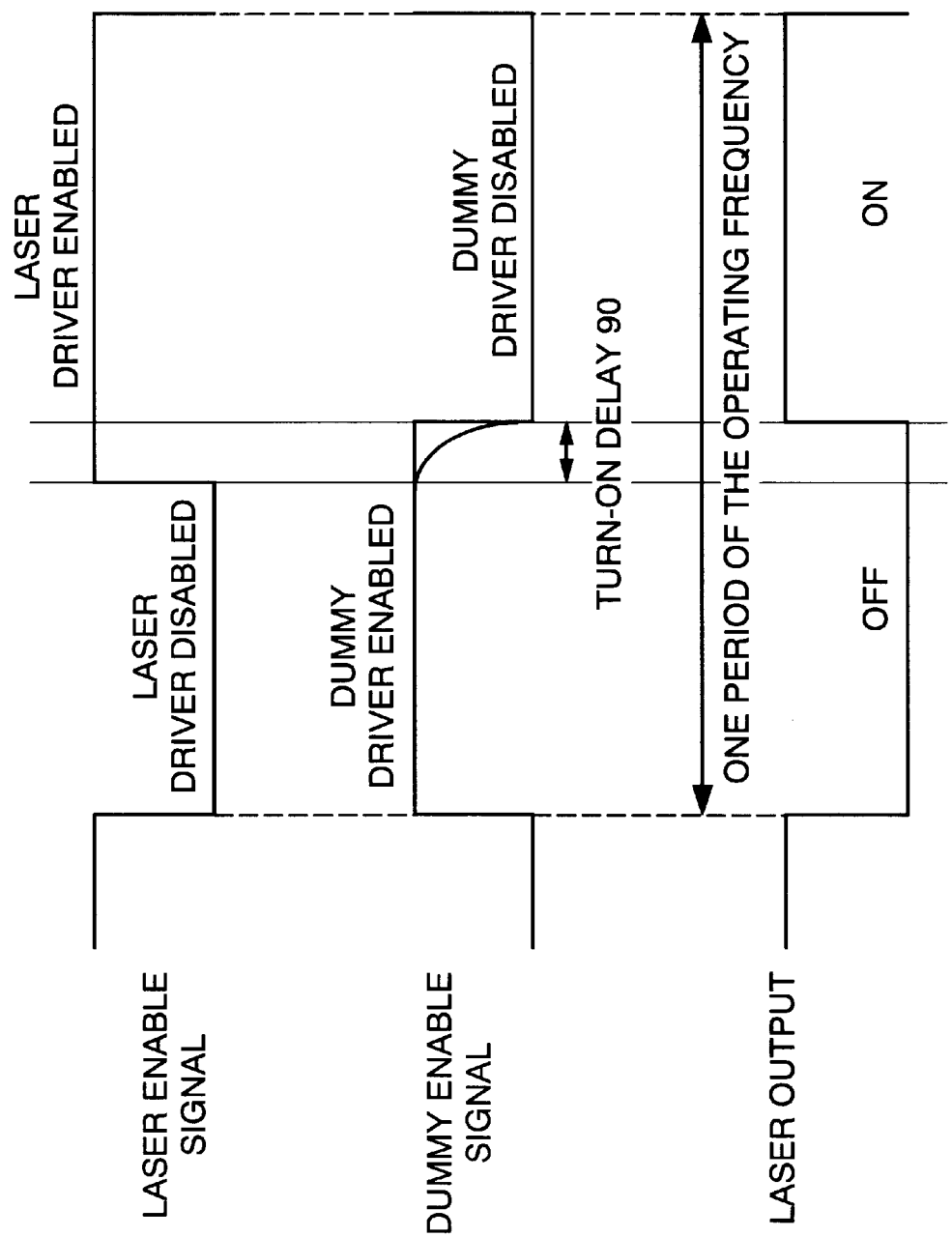
FIG. 7 is a timing diagram showing the relationship between the laser driver circuit and the dummy driver circuit of the laser driver system of FIG. 4 according to the invention.

Referring now to FIG. 7, a timing diagram depicts the operation of the laser enable signal 51 and the dummy enable signal 62 at the increased sample operating frequency of 50 MHz. The operating frequency refers to the amount of time during which the system is required to enable and disable the laser driver circuit 50 (and hence, enable and disable the dummy driver circuit 64). Regardless of the amount of time that the laser driver circuit 50 can respond to the enable signal 51, the laser diode 28 imparts a turn-on delay period 90 of approximately five nanoseconds.

In prior art approaches, the dummy driver circuit 64 is disabled at the beginning of the turn-on delay period 90. Therefore, since the laser diode does not generate a beam until that turn-on delay period has expired, the output beam power from the laser diode 28 appears too low to the feedback loop. Responsively, the feedback loop increases the adjusted power command signal 47 to compensate. When the turn-on delay period 90 has expired, a beam is generated by the laser diode 28. However, due to the increased current being generated by the laser driver circuit 50, the laser diode output beam power is unnecessarily increased and hence the intensity of the pixel locations on the photosensitive media will be unnecessarily increased. Accordingly, the present invention automatically extends the period of time that the dummy driver circuit 64 is turned on, such that the laser diode output power is automatically corrected.

Figure 8:
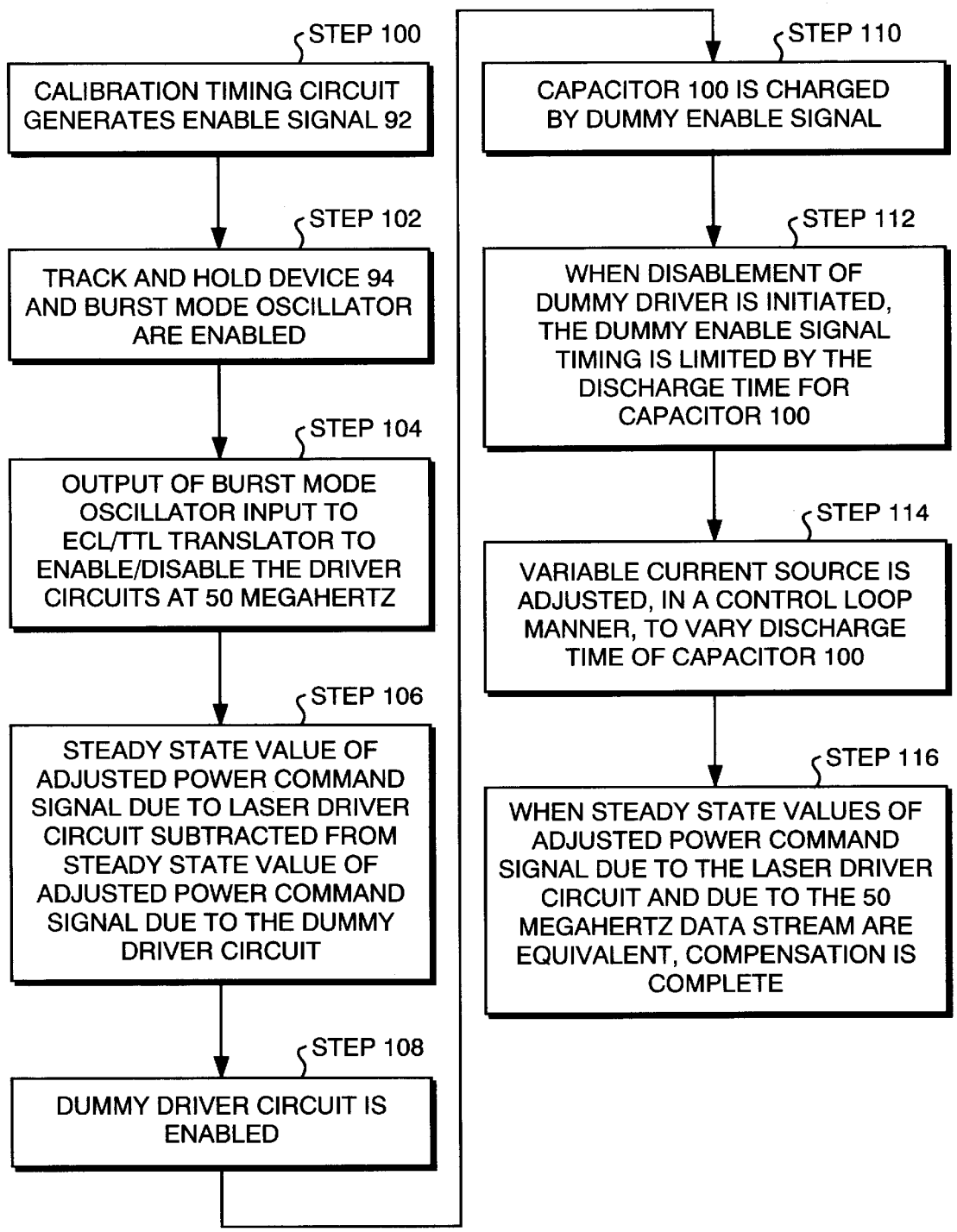
FIG. 8 is a flow diagram depicting the operation of the burst mode time delay correlation circuit that is part of the laser driver system of FIG. 4 according to the invention.

With respect to FIG. 8 and to the schematic diagram of FIG. 5, the circuit 39 that performs the above mentioned compensation, referred to as the burst mode time delay correction, will be described. A predetermined time period after calibration timing circuit 74 generates enable signal 75 (see FIG. 5), it generates enable signal 92 (Step 100). Enable signal 92 enables the track and hold device 94 and burst mode oscillator 96 (Step 102). The output of the burst mode oscillator 96 is input to the ECL/TTL translator 60 such that the dummy driver 64 and the laser driver 50 are alternatively enabled and disabled at a rate of 50 megahertz (Step 104). It should be noted that the burst mode oscillator is not limited to a frequency of 50 megahertz. Rather, any oscillator may be used, determined by the operating characteristics of the driver circuits utilized and by the desired operating frequency.

The track and hold device 94 subtracts the steady state value of the adjusted power command signal 47 due to the laser driver circuit 50 (as determined during the automatic operating point correlation described with respect to FIG. 5) from the current steady state value of the adjusted power command signal 47 due to the 50 megahertz simulated data signal (Step 106). That difference value, output on signal line 95, represents the error in the laser diode output power due to the turn-on time delay period 90. The signal on signal line 95 is used to compensate for the turn-on time delay period 90 by delaying the time when the dummy driver circuit 64 is turned off, i.e. disabled. The signal 95 adjusts a variable current source device 98 that is connected in parallel with a ten picofarad capacitor 100 across the dummy enable signal 62.

When the dummy enable signal 62 is asserted to a logic high level, dummy driver circuit 64 is enabled (Step 108). Accordingly, capacitor 100 is charged by that logic high level (Step 110). Alternatively, when the disablement of the dummy driver circuit 64 is initiated, the falling edge of the dummy enable signal 62 is limited by the discharge time for capacitor 100 (Step 112). That discharge time can be shortened or extended based on the amount of current that is drawn by the variable current source 98. Accordingly, the amount of current drawn by variable current source 98 is incrementally adjusted, in a control loop manner, in response to the difference value output from the track and hold device 94 (Step 114). When the steady state value of the adjusted power command signal 47 due to the laser driver circuit 50, is equivalent to the steady state value of the adjusted power command signal 47 due to the 50 megahertz data stream, the amount of current being drawn from variable current source 98 is sufficient to compensate for the turn-on time delay 90 (Step 116). In other words, the trailing edge of the dummy enable signal 62 has been sufficiently extended such that the laser diode output power is not unnecessarily increased due to the turn-on time delay 90. Thereafter, there will be essentially no intensity increase due to the turn-on time delay period for the laser diode 28. The burst mode time delay correction operation is repeated at the end of each scan line.

Therefore, the present invention overcomes the problems associated with the turn-on delay 90 inherent in laser diode 28.

It should also be noted that because the diode threshold current or "knee" changes in relation to manufacturing tolerances and the ambient temperature, signal line 95 can be used to adjust the quiescent operating point of the bias current. The above mentioned turn-on time delay changes linearly as the bias current approaches the threshold current. The closer that the bias current is to the threshold current, the faster that the diode turns on and the turn-on distortion is reduced. However, increasing the bias current decreases the contrast ratio, i.e. the intensity ratio between the LED and Laser regions of operation. Therefore, a tradeoff between bias current and diode fidelity is made, using signal 95, such that the laser diode operation is optimized.

Many circuits similar to those described above can be designed using different component values, combinations and architectures which will yield the same results as the claimed invention. Thus, while this invention has been particularly shown and described with references to preferred embodiments herein, it is understood by those skilled in the art that various form changes in and details may be made therein without departing from the scope of the invention as defined by the appended claims.

What is claimed is:

1. An imagesetter device for imposing an image on photosensitive media, said imagesetter device including a laser diode driver system comprising:

a laser driver circuit for generating a first operating current for controlling a laser diode in response to a first command signal;

a dummy driver circuit for generating a second operating current, in response to a second command signal, for controlling a dummy load when the laser diode is turned off, the dummy load simulating an operating characteristic of the laser diode; and a calibration circuit for automatically adjusting the second command signal such that the second operating current generated by said dummy driver circuit is the same as the first operating current generated by said laser driver circuit.

2. A laser diode driver system as described in claim 1, further comprising:

a laser feedback signal, generated in response to said first operating current, for adjusting the first command signal such that the first operating current produces a desired amount of laser diode output power that is proportionate to the first command signal; and a dummy feedback signal, generated in response to the second operating current, for adjusting the first command signal such that the second operating current is equivalent to the first operating current.

3. A laser diode driver system as described in claim 2, wherein said calibration circuit automatically adjusts the second command signal in response to a steady state value of the laser feedback signal generated when said laser driver circuit is generating said first operating current and further in response to a steady state value of said dummy feedback signal generated when said dummy driver circuit is generating said second operating current.

4. A laser driver system as described in claim 3 wherein said calibration circuit generates an error signal associated with a difference between the steady state value of the laser feedback signal and the steady state value of the dummy feedback signal.

5. A laser driver system as described in claim 4 wherein said error signal is subtracted from the first control signal such that the steady state value of the dummy feedback signal is equivalent to the steady state value of the laser feedback signal.

6. A method for automatically adjusting an operating point of a laser driver system, comprising the steps of:

monitoring a steady state value of a laser feedback signal associated with a laser driver circuit, said laser driver circuit for driving a laser diode in response to an adjusted power command signal;

monitoring a steady state value of a dummy feedback signal associated with a dummy driver circuit, said dummy driver circuit for driving a dummy load in response to the adjusted power command signal; and automatically adjusting said adjusted power command signal such that the steady state value of the dummy feedback signal is equivalent to the steady state value of the laser feedback signal.

7. A method for automatically adjusting an operating point of a laser driver system as described in claim 6, further comprising the steps of:

subtracting the steady state value of the dummy feedback signal from the steady state value of the laser feedback signal to determine a value to subtract from the adjusted power command signal such that the steady state value of the dummy feedback signal is equivalent to the steady state value of the laser feedback signal.

8. A method for automatically adjusting an operating point of a laser driver system as described in claim 7 wherein the steady state value of the laser feedback signal is monitored when the laser driver circuit is generating a first operating current that is input to a laser diode.

9. A method for automatically adjusting an operating point of a laser driver system as described in claim 8 wherein the steady state value of the dummy feedback signal is monitored when the dummy driver circuit is generating a second operating current that is input to a dummy load, the dummy load simulating an operating characteristic of the laser diode.

10. An apparatus for performing an automatic burst mode time delay correction, comprising;

a laser driver circuit for generating a first operating current for controlling a laser diode in response to a first command signal, said laser driver circuit enabled by a laser enable signal;

a dummy driver circuit for generating a second operating current, in response to a second command signal, for controlling a dummy load when the laser diode is turned off, said dummy driver circuit enabled and disabled by a dummy enable signal; and a variable current device and a capacitive device, coupled to the dummy enable signal, said variable current device being adjusted such that said dummy driver circuit is not disabled until after an activation period for the laser diode has expired.

11. An apparatus for performing a burst mode time delay correction as described in claim 10, further comprising:

a laser feedback signal, generated in response to said first operating current, for adjusting the first command signal such that the first operating current produces a desired amount of laser diode output power that is proportional to the first command signal; and a first tracking device for latching a steady state value of the first command signal, said steady state value due to said laser driver circuit being enabled.

12. An apparatus for performing a burst mode time delay correction as described in claim 11, further comprising:

an oscillator, for asserting and deasserting the laser enable signal and the dummy enable signal, in an alternating manner, at a selected frequency; and a second tracking device for latching a difference between the steady state value of the first command signal due to said laser driver circuit being enabled and a steady state value of the first command signal due to the laser enable signal and the dummy enable signal being asserted and deasserted at the selected frequency.

13. An apparatus for performing a burst mode time delay correction as described in claim 12, wherein said difference is used for adjusting said variable current device in a feedback loop manner, until the steady state value of the first command signal due to the laser enable signal and the dummy enable signal being asserted at the selected frequency, is equivalent to the steady state value of the first command signal due to said laser driver circuit being enabled.

14. An apparatus for performing a burst mode time delay correction as described in claim 13, wherein said oscillator outputs a signal at a selected frequency of fifty Megahertz.

15. A method for performing an automatic burst mode time delay correction, comprising the steps of:

generating a first operating current, by a laser driver circuit, in response to a first command signal and in response to a first enable signal;

allowing the laser driver circuit to attain a steady state condition;

latching a first representation of an amount of power output by a laser diode coupled to the laser driver circuit in response to the first operating current;

generating a second operating current, by the laser driver circuit, in response to the first command signal and in response to a second enable signal, said second enable signal alternatively enabling and disabling the laser driver circuit and a dummy driver circuit at a selected frequency;

latching a second representation of an amount of power output by the laser diode in response to the second operating current; and varying a current drawn by a device coupled to the second enable signal such that the rate that the second enable signal is deasserted is changed until the first and second representations of the amount of power output by the laser diode are equivalent.

16. A method for performing an automatic burst mode time delay correction as described in claim 15, wherein said steady state condition is attained by enabling the laser driver circuit for a preselected time period during which the first representation of the amount of power output by the laser diode becomes essentially constant.

17. A method for performing an automatic burst mode time delay correction as described in claim 16, wherein the second representation of the amount of power output by the laser diode is latched after the laser driver circuit has regained a steady state condition.

18. A method for performing an automatic burst mode time delay correction as described in claim 15, wherein said varying step further comprises the steps of:

varying the amount of current drawn by said device such that a capacitive element, coupled to the second enable signal, discharges at a rate associated with the amount of current; and allowing the second enable signal to deassert at the same rate that the capacitive element is discharged.

19. A laser diode driver system for an imagesetter, the system comprising:

a laser driver circuit that drives a laser diode that selectively exposes a photosensitive media and generates a feedback signal for closed-loop power control;

a dummy driver circuit that supplies a dummy feedback signal for the laser diode control loop when the laser diode is turned off; and a calibration circuit for automatically tuning the dummy driver circuit to improve correlation between the dummy feedback signal and the feedback signal from the laser driver circuit.

* * * * *